(12) United States Patent
Hwang

(10) Patent No.: US 11,112,667 B1
(45) Date of Patent: Sep. 7, 2021

(54) DISPLAY DEVICE

(71) Applicant: Samsung Display Co., LTD., Yongin-si (KR)

(72) Inventor: Jung Hwan Hwang, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/005,198

(22) Filed: Aug. 27, 2020

(30) Foreign Application Priority Data

Mar. 4, 2020 (KR) ........................ 10-2020-0027042

(51) Int. Cl.
| | |
|---|---|
| G02F 1/1362 | (2006.01) |
| H01L 27/12 | (2006.01) |
| G02F 1/1368 | (2006.01) |
| G02F 1/1343 | (2006.01) |
| G02F 1/1333 | (2006.01) |

(52) U.S. Cl.
CPC ...... *G02F 1/136286* (2013.01); *G02F 1/1368* (2013.01); *G02F 1/133345* (2013.01); *G02F 1/134309* (2013.01); *G02F 1/136213* (2013.01); *H01L 27/124* (2013.01); *G02F 2201/121* (2013.01)

(58) Field of Classification Search
CPC .............................................. G02F 1/136213
See application file for complete search history.

(56) References Cited

U.S. PATENT DOCUMENTS

| | | | |
|---|---|---|---|
| 7,142,267 B2 | 11/2006 | Hector et al. | |
| 7,471,357 B2 | 12/2008 | Ahn et al. | |
| 8,537,104 B2 | 9/2013 | Markvoort et al. | |
| 10,340,297 B2 | 7/2019 | Kim et al. | |
| 2003/0030606 A1* | 2/2003 | Hector | G02F 1/136286 345/87 |
| 2005/0253979 A1* | 11/2005 | Hong | G02F 1/136213 349/43 |
| 2007/0164958 A1* | 7/2007 | Edwards | G02F 1/136286 345/92 |

FOREIGN PATENT DOCUMENTS

| | | |
|---|---|---|
| KR | 10-1127817 | 3/2012 |
| KR | 10-1519609 | 5/2015 |
| KR | 10-2017-0118997 | 10/2017 |

* cited by examiner

*Primary Examiner* — James A Dudek
(74) *Attorney, Agent, or Firm* — H.C. Park & Associates, PLC

(57) ABSTRACT

A display device includes: a liquid crystal layer between a first substrate and a second substrate; a contact region electrically connecting one of horizontal gate lines to one of vertical signal lines; a plurality of data lines; and a plurality of pixels including transistors that are electrically connected to the horizontal gate lines and the data lines, wherein: the plurality of pixels includes a kickback pixel defined as a pixel that is affected by a kickback voltage caused by the one vertical signal line, and a normal pixel defined as a pixel that is less affected by the kickback voltage caused by the one vertical signal line than the kickback pixel, and the liquid crystal layer in the kickback pixel having a first cell gap, and the liquid crystal layer in the normal pixel having a second cell gap greater than the second cell gap.

20 Claims, 12 Drawing Sheets

DISPLAY DEVICE

CROSS-REFERENCE TO RELATED APPLICATION

This application claims priority from and the benefit of Korean Patent Application No. 10-2020-0027042, which is hereby incorporated by reference for all purposes as if fully set forth herein.

BACKGROUND

Field

Exemplary implementations of the invention relate generally to a display device and more specifically, a display device having a wide display area.

Discussion of the Background

A display device includes a display panel including a plurality of pixels capable of displaying an image, and a plurality of signal lines. Each of the pixels may include a pixel circuit unit including at least one transistor connected to a signal line and a display unit capable of displaying an image. The signal line connected to the transistor includes a gate line for transferring a gate signal and a data line for transferring a data signal.

The display device includes a driving unit that generates and applies a driving signal capable of driving the pixels. The driving unit includes a gate driving circuit for generating a gate signal and a data driving circuit for generating a data signal. Generally, the data driving circuit is disposed in a peripheral area of the display panel where an end portion of the data line is positioned, and the gate driving circuit is disposed in a peripheral area of the display panel where an end portion of the gate line extending in a direction different from the data line is positioned. Accordingly, the gate driving circuit and data driving circuit occupy the peripheral areas positioned at least two sides of the display panel.

Each pixel includes a pixel electrode for receiving a data signal through at least one transistor. A voltage of the pixel electrode or a voltage of a terminal of a transistor connected to the pixel electrode may be affected by a voltage change of a signal line coupled to the surroundings.

The above information disclosed in this Background section is only for understanding of the background of the inventive concepts, and, therefore, it may contain information that does not constitute prior art.

SUMMARY

Applicant discovered that pixels in a display device are differently affected by a kickback voltage caused by a signal line that produces stains (or irregularities) in an image displayed by the display device.

Display devices constructed according to the principles of the invention and exemplary embodiments of the invention provide a wide display area by reducing the dead space in the display and minimizing or preventing stains (or irregularities) in images displayed by the display devices caused by variations in kickback voltages. For example, the dead space may be reduced and the occurrence of stains due to variations in a kickback voltage minimized or prevented by providing different cell gaps for normal pixels and kickback pixels, which are those more affected by kickback voltages than the normal pixels.

Additional features of the inventive concepts will be set forth in the description which follows, and in part will be apparent from the description, or may be learned by practice of the inventive concepts.

According to one aspect of the invention, a display device includes: a first substrate and a second substrate facing each other; a liquid crystal layer disposed between the first substrate and the second substrate; a plurality of horizontal gate lines disposed on the first substrate and extending generally in a first direction; a plurality of vertical signal lines disposed in a conductive layer that is different from the horizontal gate lines and extending in a second direction intersecting the first direction; a contact region electrically connecting one of the horizontal gate lines to one of the vertical signal lines; a plurality of data lines extending in the second direction; and a plurality of pixels including transistors that are electrically connected to the horizontal gate lines and the data lines, wherein the plurality of pixels includes a kickback pixel defined as a pixel that is affected by a kickback voltage caused by the one vertical signal line, and a normal pixel defined as a pixel that is less affected by the kickback voltage caused by the one vertical signal line than the kickback pixel, and wherein the liquid crystal layer in the kickback pixel has a first cell gap, and the liquid crystal layer in the normal pixel has a second cell gap greater than the first cell gap.

The kickback pixel may be directly adjacent to the one vertical signal line in the first direction.

The kickback pixel may include a first kickback pixel and a second kickback pixel that are disposed at opposite sides of one of the plurality of vertical signal lines and may be configured to display different colors.

The normal pixel may include a first normal pixel to display a different color than the colors displayed by the first kickback pixel and the second kickback pixel, and at least one of the first and second kickback pixels is disposed between the first normal pixel and a vertical signal line of the plurality of vertical signal lines disposed closest to the first normal pixel.

The contact region may include a contact portion, and the normal pixel may be adjacent or spaced in the second direction with respect to a pixel electrically connected to the one horizontal gate line that is electrically connected to the one vertical signal line through the contact portion.

The kickback pixel may include a pixel in at least one pixel row that is adjacent in a direction opposite to the second direction with respect to a pixel electrically connected to the one horizontal gate line that is electrically connected to the one vertical signal line through the contact portion.

The number of pixel rows of the kickback pixel adjacent to each other in the second direction may be a product of "a" and "b" when a number of adjacent horizontal gate lines electrically connected to one of the plurality of vertical signal lines through the contact region may be "a" (wherein "a" is a natural number), when a period during which a gate-on voltage of a gate signal transmitted by the one horizontal gate line is maintained is "b" horizontal periods (wherein "b" is a natural number), and when a period in which gate-on voltage periods of neighboring gate signals overlap each other is (b−1) horizontal periods.

The display device may further include a plurality of insulating layers positioned between the first substrate and the liquid crystal layer, wherein at least one insulating layer of the plurality of insulating layers in the normal pixel may have a first thickness, and the at least one insulating layer in the kickback pixel may have second thickness greater than the first thickness.

The first thickness may be substantially zero.

The plurality of insulating layers may include a first insulating layer disposed between the one horizontal gate line and the one vertical signal line, the contact region may include a contact portion formed in the first insulating layer as a first opening on the one horizontal gate line, and the at least one insulating layer may include the first insulating layer.

The display device may further include: a common electrode disposed below the second substrate and a pixel electrode electrically connected to the transistors, wherein the pixel electrode and the common electrode may face each other with the liquid crystal layer therebetween to form a liquid crystal capacitor.

According to another aspect of the invention, a display device includes: a first substrate and a second substrate facing each other; a liquid crystal layer disposed between the first substrate and the second substrate; a plurality of horizontal gate lines disposed on the first substrate and extending generally in a first direction; a plurality of vertical signal lines disposed in a conductive layer that is different from the horizontal gate lines and extending in a second direction intersecting the first direction; a contact region electrically connecting one of the horizontal gate lines to one of the vertical signal lines; a plurality of data lines extending in the second direction; and a plurality of pixels including transistors that are electrically connected to the horizontal gate lines and the data lines, wherein the plurality of pixels includes a first pixel that is directly adjacent to the one vertical signal line in the first direction and a second pixel interposed between at least one pixel and the one vertical signal line adjacent to the second pixel, and wherein the liquid crystal layer in the first pixel has a first cell gap, and the liquid crystal layer in the second pixel has a second cell gap greater than the first cell gap.

The first pixel may include a first kickback pixel and a second kickback pixel that are disposed at opposite sides of a vertical signal line of the plurality of vertical signal lines and may be configured to display different colors.

The second pixel may be configured to display a different color from colors displayed by the first kickback pixel and the second kickback pixel.

The display device may further include a plurality of insulating layers positioned between the first substrate and the liquid crystal layer, wherein at least one insulating layer of the plurality of insulating layers disposed in the first pixel may have a first thickness, the at least one insulating layer in the second pixel may have a second thickness smaller than the first thickness.

The first thickness may be substantially zero.

The plurality of insulating layers may include a first insulating layer disposed between the one horizontal gate line and the one vertical signal line, the contact region may include a contact portion formed in the first insulating layer as a first opening on the one horizontal gate line, and the at least one insulating layer may include the first insulating layer.

The display device may further include: a common electrode disposed below the second substrate; and a pixel electrode electrically connected to the transistors, wherein the pixel electrode and the common electrode may face each other with the liquid crystal layer therebetween to form a liquid crystal capacitor.

According to another aspect of the invention, a display device includes: a first substrate; a plurality of horizontal gate lines disposed on the first substrate and extending generally in a first direction; a plurality of vertical signal lines disposed in a conductive layer that is different from the horizontal gate lines and extending in a second direction intersecting the first direction; a plurality of data lines extending in the second direction; a transistor electrically connected to a horizontal gate line of the plurality of horizontal gate lines and a data line of the plurality of data lines; a pixel electrode electrically connected to the transistor; and an insulating layer disposed between the horizontal gate line and the vertical signal line, wherein the insulating layer has an opening disposed on the horizontal gate line, the vertical signal line is electrically connected to the horizontal gate line through the opening, at least three pixel electrodes are adjacent to each other between two adjacent vertical signal lines, and the insulating layer overlapping a first pixel electrode disposed in the middle of the at least three pixel electrodes has a first average thickness and the insulating layer overlapping a second pixel electrode of the at least three pixel electrode immediately adjacent the vertical signal lines has a second average thickness with the first average thickness being smaller than the second average thickness.

The insulating layer overlapping the first pixel electrode may have a recess overlapping the first pixel electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
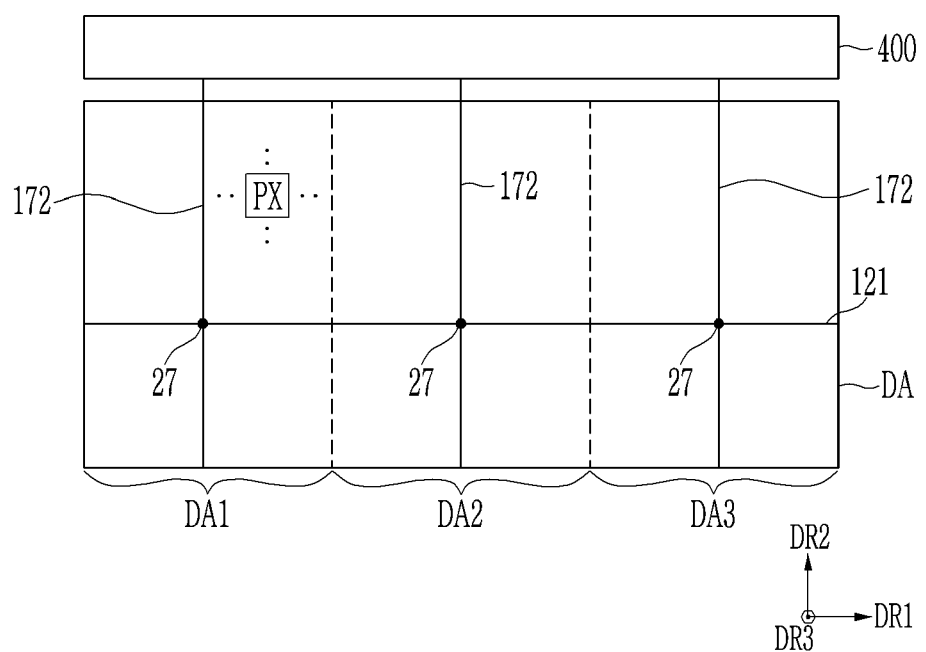
FIG. 1 is a schematic layout view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements, and descriptions of well known or irrelevant parts may be omitted for clarity.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Throughout this specification, a plan view means a view when observing a surface parallel to two directions (e.g., a first direction DR1 and a second direction DR2) intersecting each other, and a cross-sectional view means a view when observing a surface cut in a direction (e.g., a third direction)

perpendicular to the surface parallel to the first direction DR1 and the second direction DR2. In addition, to overlap two constituent elements means that two constituent elements are overlapped in the third direction (e.g., a direction perpendicular to an upper surface of the substrate) unless stated otherwise.

Hereinafter, a structure of a display device constructed according to the principles of the invention will be described with reference to FIG. 1 to FIG. 5.

Figure 2:
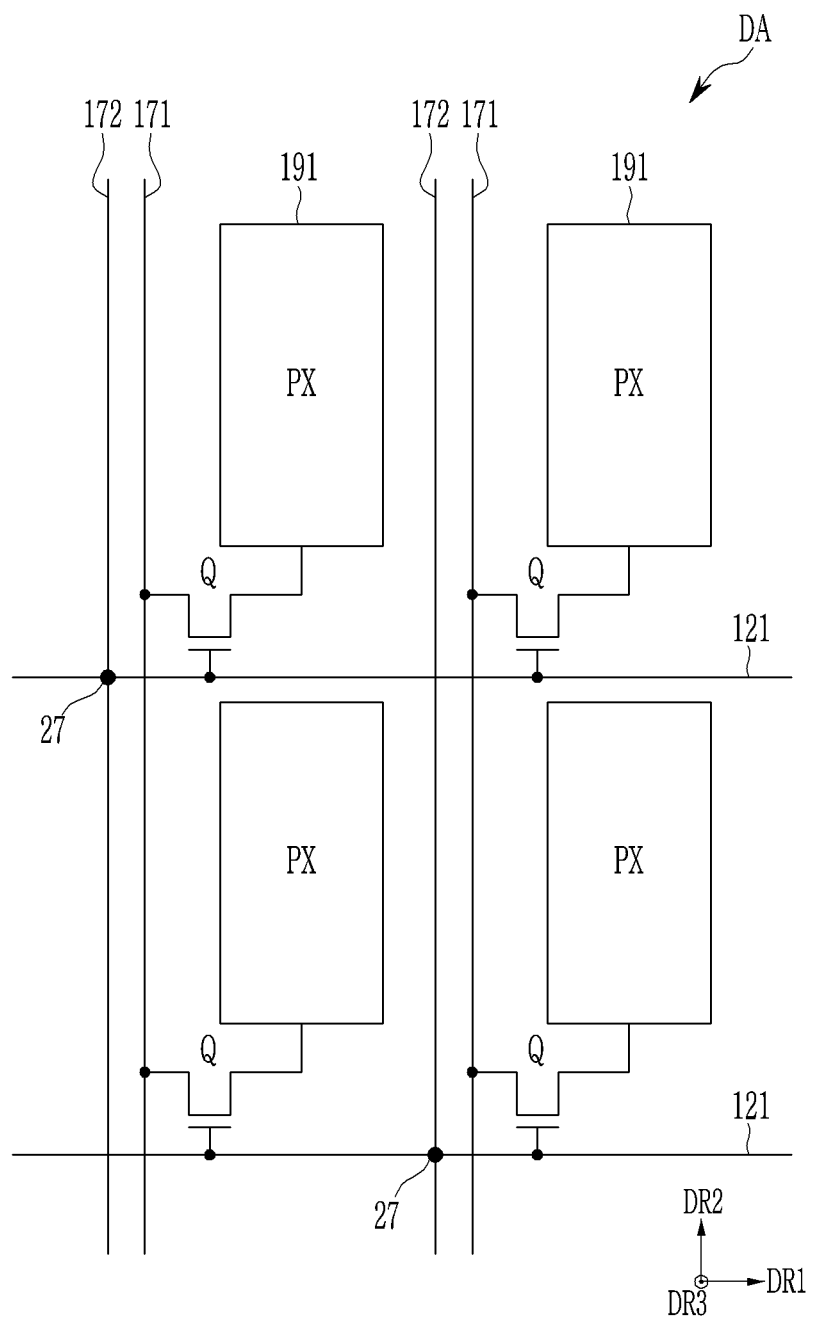
FIG. 2 is a schematic circuit view of representative pixels in a display area of the display device of FIG. 1.
Figure 3:
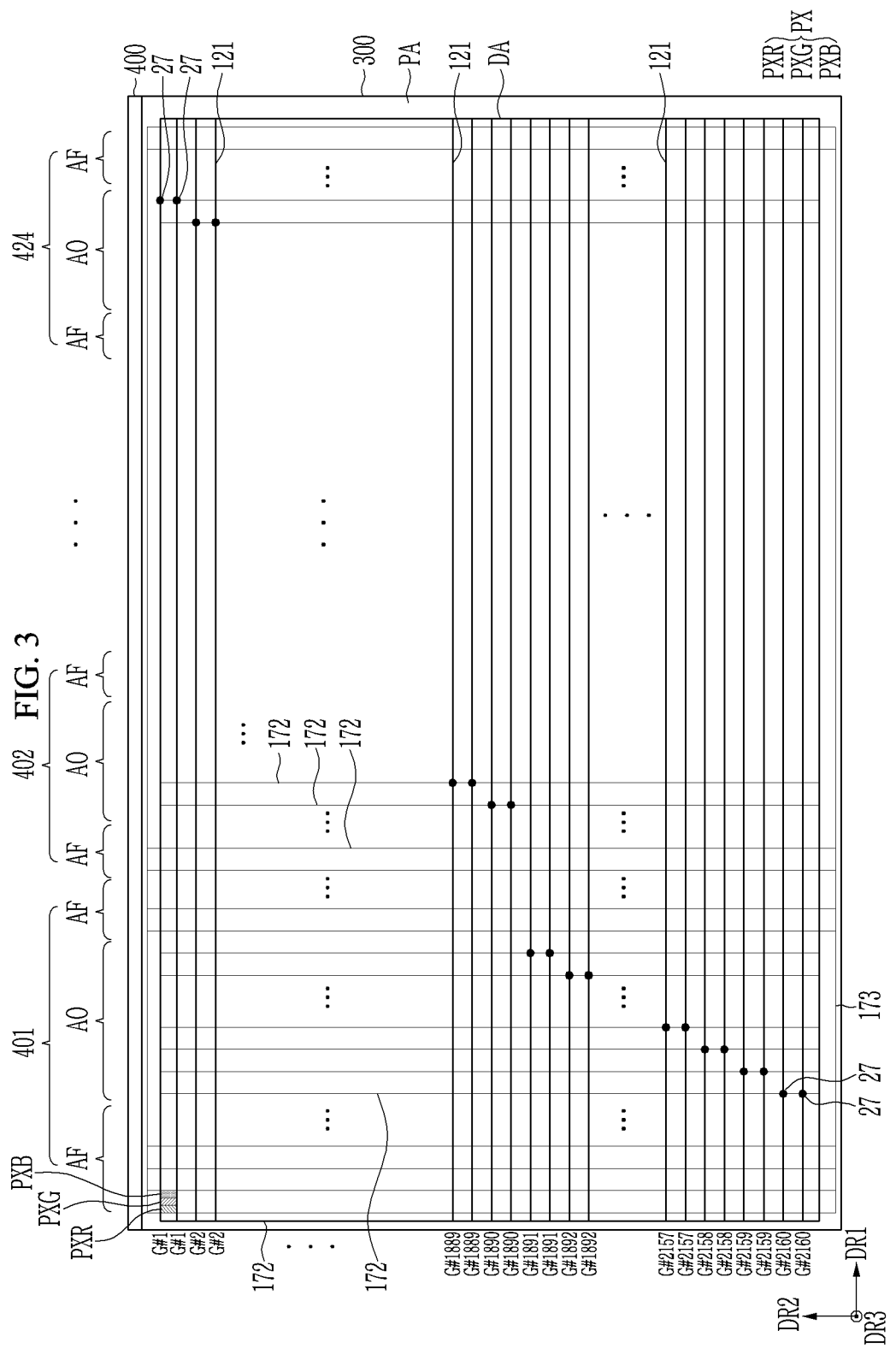
FIG. 3 is a schematic layout view of signal lines of the display device of FIG. 1.
Figure 4:
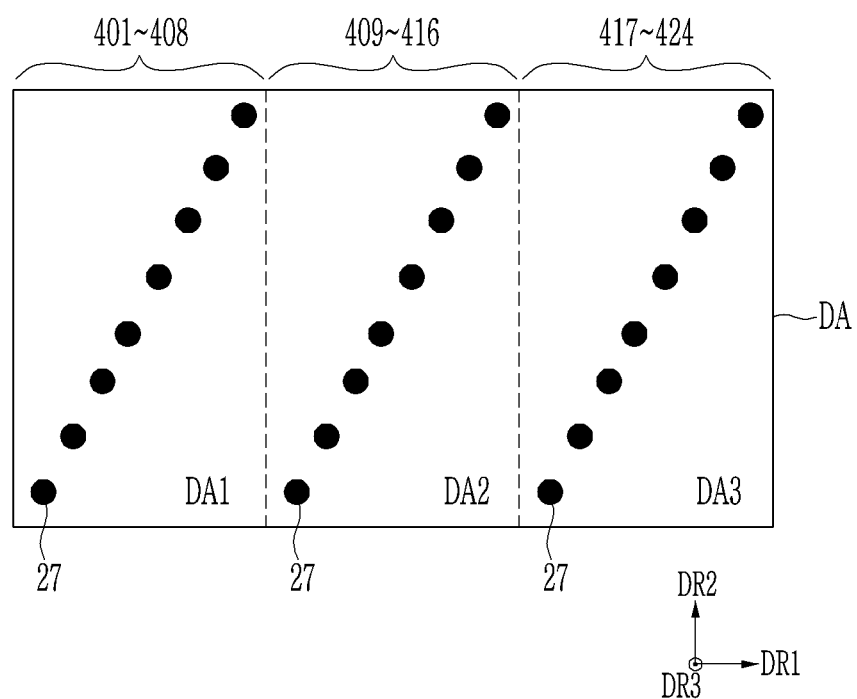
FIG. 4 is a layout view of contact portions between the signal lines of the display device of FIG. 3.
Figure 5:
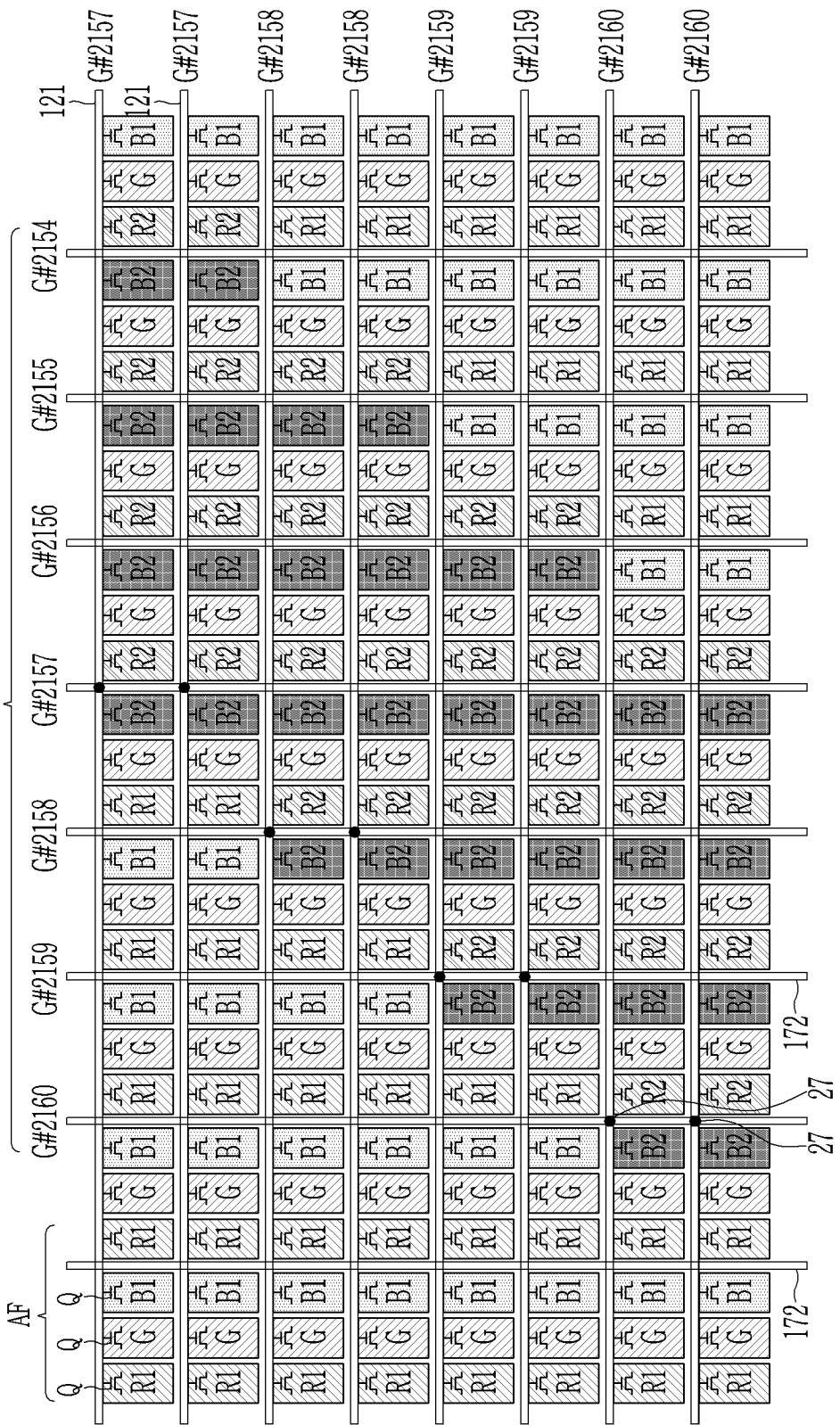
FIG. 5 is a layout view of the pixels and the signal lines of the display device of FIG. 1.

FIG. 1 is a schematic layout view of an exemplary embodiment of a display device constructed according to the principles of the invention, FIG. 2 is a schematic circuit view of representatives pixels of a display area of the display device of FIG. 1, FIG. 3 is a schematic layout view of signal lines of the display device of FIG. 1, FIG. 4 is a layout view of contact portions of the signal lines of the display device of FIG. 3, and FIG. 5 is a layout view of the pixels and the signal lines of the display device of FIG. 1.

Referring to FIG. 1, a display device according to an exemplary embodiment of the invention includes a display area DA and a driving unit 400.

The display area DA may include a plurality of horizontal gate lines 121, a plurality of vertical signal lines 172, and a plurality of pixels PX.

Each of the horizontal gate lines 121 may extend substantially in the first direction DR1, and the horizontal gate lines 121 may be arranged substantially in the second direction DR2.

Each of the vertical signal lines 172 may extend substantially in the second direction DR2, and the vertical signal lines 172 may be arranged substantially in the first direction DR1.

The driving unit 400 may supply driving signals for driving the pixels PX in the display area DA through the vertical signal lines 172. The vertical signal lines 172 may extend outside the display area DA to be electrically connected to the driving unit 400, and the vertical signal lines 172 may receive the driving signals from the driving unit 400.

Some or all of the vertical signal lines 172 may be electrically connected to at least one horizontal gate line 121 through a contact region that may be in the form of a contact portion 27 of the signal lines and gate lines to transfer a driving signal to the at least one horizontal gate line 121. Herein, the driving signal may include a gate signal including a gate-on voltage and a gate-off voltage. In the following description, the expression "when the gate signal is applied" means that the gate-on voltage is applied.

Each horizontal gate line 121 may be electrically connected to one vertical signal line 172 among the vertical signal lines 172, and alternatively, as illustrated in FIG. 1, each horizontal gate line 121 may be electrically connected to two or more vertical signal lines 172 among the vertical signal lines 172.

When each horizontal gate line 121 is electrically connected to n (wherein n is a natural number of 2 or more) vertical signal lines of the vertical signal lines 172, the display area DA may be divided into n sub-display areas DA1, DA2, . . . , and DAn. The n sub-display areas DA1, DA2, . . . , and DAn may be sequentially arranged in the first direction DR1.

For example, as illustrated in FIG. 1, when each horizontal gate line 121 is electrically connected to three vertical signal lines 172 among the vertical signal lines 172, the display area DA may be divided into three sub-display areas DA1, DA2, and DA3 arranged in order in the first direction DR1. The horizontal gate line 121 may pass through all three sub-display areas DA1, DA2, and DA3, and only one vertical signal line 172 may be electrically connected to the corresponding horizontal gate line 121 in each of the sub-display areas DA1, DA2, and DA3.

In other words, in each of the sub-display areas DA1, DA2, . . . , and DAn, each of the horizontal gate lines 121 may be electrically connected to one vertical signal line 172.

In the display area DA or each of the sub-display areas DA1, DA2, . . . , and DAn, different horizontal gate lines 121 may be electrically connected to different vertical signal lines 172, or alternatively, two or more adjacent horizontal gate lines 121 may be electrically connected to a same vertical signal line 172.

Each of the pixels PX may include a pixel circuit unit including at least one transistor that is electrically connected to a corresponding horizontal gate line 121 and a display unit for emitting light of an image.

Referring to FIG. 2, the display area DA may further include a plurality of data lines 171 for transferring data signals, which are electrically insulated from the vertical signal line 172.

Each of the data lines 171 may extend substantially in the second direction DR2, and the data lines 171 may be arranged substantially in the first direction DR1.

The pixel circuit unit of each pixel PX may include a transistor Q that is electrically connected to the horizontal gate line 121 and the data line 171. The display unit of each pixel PX may include a pixel electrode 191 that is electrically connected to the transistor Q. The pixel electrode 191 of each pixel PX may receive a data voltage of the data signal transferred through the data line 171 and the turned-on transistor Q when it is turned on.

Referring to FIG. 3, the display device includes a display panel 300. The display panel 300 may include a display area DA and a peripheral area PA that is externally positioned around the display area DA, as described above.

The driving unit 400 described above may be disposed in the peripheral area PA of the display panel 300. For example, as illustrated in FIG. 3, the driving unit 400 may be disposed in an upper portion of the peripheral area PA of the display panel 300. The driving unit 400 may include at least one driving circuit chip attached on the display panel 300.

The driving unit 400 may include a plurality of gate driving circuit units 401, 402, . . . , and 424 arranged in order in the first direction DR1. FIG. 3 illustrates an example in which the driving unit 400 includes 24 gate driving circuit units 401, 402, . . . , and 424, but exemplary embodiments are not limited thereto. Each of the gate driving circuit units 401, 402, . . . , and 424 may be implemented as one driving circuit chip.

The gate driving circuit units 401, 402, . . . , and 424 are electrically connected to the plurality of vertical signal lines 172 in the corresponding display area DA in order from left to right. Each of the gate driving circuit units 401, 402, . . . , and 424 may scan and apply a gate signal having the gate-on voltage or the gate-off voltage to the vertical signal line 172 in a scanning area AO among the vertical signal lines 172 in the first direction DR1. A substantially constant voltage, such as the gate-off voltage, may be applied to the vertical signal line 172 in an off area AF. However, exemplary embodiments are not limited thereto. For example, the size of the off region AF may be changed depending on the particular configuration such as resolution of the display panel 300 and the number of horizontal gate lines 121, or it may be omitted.

For example, when the vertical signal line 172 in the off area AF is omitted, the scanning area AO where the vertical signal line 172 is positioned and the off area AF where the vertical signal line 172 is not positioned may be recognized separately from each other (or observed distinguishably) by a user. However, when the vertical signal line 172 is formed in the off area AF, the scanning area AO and the off area AF may not be observed distinguishably by the user. Therefore, uniformity of image quality of the entire display area DA may be improved by forming the vertical signal line 172 in both the scanning area AO and the off area AF.

The scanning area AO may be positioned between two off areas AF positioned at opposite sides thereof.

The vertical signal line 172 in the off area AF is not electrically connected to the horizontal gate line 121 in the display area DA. The plurality of vertical signal lines 172 in the off area AF may extend to the peripheral area PA to be electrically connected to each other in the peripheral area PA. For example, as illustrated in FIG. 3, the vertical signal lines 172 in the off area AF may extend from the upper peripheral area PA to the lower peripheral area PA so as to electrically connect to each other through a separate connection line 173 extending in the first direction DR1 in the lower peripheral areas PA of the display panel 300.

Each of the horizontal gate lines 121 in the display area DA may be electrically connected to the vertical signal line 172 in the corresponding scanning area AO through the contact portion 27 to receive a gate signal. The adjacent plurality of horizontal gate lines 121 may be electrically connected to different vertical signal lines 172, respectively. Alternatively, as illustrated in FIG. 3, two or more adjacent horizontal gate lines 121 may be electrically connected to the same vertical signal line 172 to receive a gate signal at the substantially same time.

When the number of horizontal gate lines 121 that are electrically connected to the transistors of the pixels PX is, e.g., 4320, two adjacent horizontal gate lines 121 may receive substantially the same gate signal as one the gate signals G #1, G #2, . . . , and G #2160. For example, the gate signals G #1, G #2, . . . , and G #2160 may be sequentially supplied to the corresponding two adjacent horizontal gate lines 121 from the upper side of the display panel 300.

The gate driving circuit units 401, 402, . . . , and 424 disposed sequentially from the left side of the display panel 300 may sequentially transfer gate signals to the horizontal gate lines 121 positioned sequentially from the lower side of the display panel 300. For example, the contact portion 27 positioned at the leftmost side may be connected to the horizontal gate line 121 positioned at the lowermost side of the display panel 300, and the contact portion 27 positioned at the rightmost side may be connected to the horizontal gate line 121 positioned at an uppermost side of the display panel 300. However, the connection structure between the vertical signal line 172 and the horizontal gate line 121 is not limited thereto.

Referring to FIG. 2 and FIG. 3, the driving unit 400 may further include a data driving circuit unit that is electrically connected to the data lines 171 to apply data signals to the data lines 171. The data driving circuit unit may include at least one driving circuit chip attached to the display panel 300.

The pixels PX may include a plurality of red, green, and blue pixels PXR, PXG, and PXB that are capable of displaying light of different colors. For example, the red pixel PXR may emit red light, the green pixel PXG may emit green light, and the blue pixel PXB may emit is blue light. The red, green, and blue pixels PXR, PXG, and PXB may be alternately arranged in the first direction DR1 in each pixel row. The pixels PX disposed in one pixel column may display the same color.

Referring to FIG. 4, as described above, when each horizontal gate line 121 is electrically connected to n (wherein n is a natural number of 2 or more) of the vertical signal lines 172, the display area DA may be divided into n sub-display areas DA1, DA2, . . . , and DAn. The n sub-display areas DA1, DA2, . . . , and DAn may be sequentially arranged in the first direction DR1. FIG. 4 illustrates an example in which the display area DA is divided into three sub-display areas DA1, DA2, and DA3.

In each of the sub-display areas DA1, DA2, and DA3, each of the horizontal gate lines 121 may be electrically connected to one vertical signal line 172. Accordingly, in each of the sub-display areas DA1, DA2, and DA3, the plurality of contact portions 27 may be arranged toward an upper right portion from a lower left portion of each of the sub-display areas DA1, DA2, and DA3.

At least one of the gate driving circuit units 401, 402, . . . , and 424 may be correspondingly connected to each of the sub-display areas DA1, DA2, and DA3. For example, as illustrated in FIG. 3, when the driving unit 400 includes 24 gate driving circuit units 401, 402, . . . , and 424, eight driving circuit units 401 to 408, 409 to 416, and 417 to 424 may be correspondingly connected to the sub-display areas DA1, DA2, and DA3, respectively.

According to the illustrated exemplary embodiment, the driving circuit units 401, 402, . . . , and 424 for applying gate signals to the horizontal gate lines 121 may be positioned in the upper portions of the peripheral area PA where the data driving circuit units are disposed, and may not be positioned in the left and right portions of the peripheral area PA of the display panel 300. Thus, the area of the left and right portions of the peripheral area PA with respect to the display area DA may be minimized. Accordingly, the dead space, which is an area in which an image is not displayed on the display device, may be reduced.

Referring to FIG. 5, a pixel G corresponds to the green pixel PXG described above, pixels R1 and R2 correspond to the red pixel PXR described above, and pixels B1 and B2 correspond to the blue pixel PXB described above. Each of the pixels R1, R2, G, B1, and B2 illustrated in FIG. 5 may include a transistor Q that is electrically connected to a corresponding horizontal gate line 121.

According to an exemplary embodiment, a gate signal applied to one horizontal gate line 121 may maintain a gate-on voltage for m (wherein m is a natural number) horizontal periods as a gate-on voltage period, which is indicated by H. The gate-on voltage periods of adjacent gate signals may not overlap each other, or may overlap for a certain time. FIG. 5 relates to an exemplary embodiment in which each gate signal maintains a gate-on voltage for 4H and a neighboring subsequent-stage gate signal overlaps a previous-stage gate signal for approximately 3H, but the maintenance period of the gate-on voltage and the overlapping period of the neighboring gate signal are not limited thereto.

Specifically, when a gate signal G #2160 is applied to the leftmost vertical signal line 172 (when the gate-on voltage is applied), the gate signal G #2160 may be applied to two adjacent horizontal gate lines 121 at the lower side.

When a gate signal G #2159 is applied to a next vertical signal line 172, the gate signal G #2159 may be applied to two next adjacent horizontal gate lines 121 at the upper side, and the gate signal G #2159 may maintain the gate-on voltage even while the gate signal G #2160 is applied.

When a gate signal G #2158 is applied to a next vertical signal line 172, the gate signal G #2158 may be applied to two next adjacent horizontal gate lines 121 at the upper side, and the gate signal G #2158 may maintain the gate-on voltage even while the gate signals G #2160 and G #2159 are applied.

When a gate signal G #2157 is applied to a next vertical signal line 172, the gate signal G #2157 may be applied to two next adjacent horizontal gate lines 121 at the upper side, and the gate signal G #2157 may maintain the gate-on voltage even while the gate signals G #2160, G #2159, and G #2158 are applied.

When a level of the gate signal is dropped to the gate-off voltage after the transistor Q is turned on, the voltage of a parasitic capacitor due to a pixel electrode forming a fringe field, or a terminal of the transistor Q electrically connected to the pixel electrode, may also fall. Thus, and the a charging voltage of the pixels may drop accordingly, and the dropped charging voltage of the pixels is referred to as a kickback voltage.

According to the exemplary embodiment, since the vertical signal line 172 transfers a gate signal, an additional kickback voltage may be generated in a pixel that is adjacent to the vertical signal line 172 compared to a pixel that is not adjacent to the vertical signal line 172. In FIG. 5, the pixels R2 and B2 indicate pixels receiving the kickback voltage caused by the vertical signal line 172, and the other pixels R1, G, and B1 indicate pixels receiving the kickback voltage caused by the vertical signal line 172, which is smaller than that of the pixels R2 and B2, or pixels that are hardly affected by the kickback voltage.

For example, in the case that the vertical signal line 172 maintains the gate-on voltage for 4H and then transmits the gate signal G #2157 whose level is reduced to the gate-off voltage, the pixels R2 and B2 that are electrically connected to two horizontal gate lines 121 electrically connected to the vertical signal line 172 through the contact portion 27 and six horizontal gate lines 121 positioned therebelow may also be affected by the kickback voltage due to the gate signal G #2157.

The pixels R2 and B2 that are affected by the kickback voltage caused by the vertical signal line 172 are referred to as kickback pixels PXK, and the pixels R1, G, and B1 that are not affected by the kickback voltage caused by the vertical signal line 172 are referred to as normal pixels PXN.

For one vertical signal line 172, the pixels R1 and B1 that are disposed above the pixel connected to the horizontal gate line 121 electrically connected to the vertical signal line 172 through the contact portion 27, which are directly adjacent to the vertical signal line 172 in the first direction DR1, may be the normal pixels PXN. In addition, the pixels R1 and B1 that are disposed below a predetermined number (e.g., six in FIG. 5) of pixel rows from pixels connected to the horizontal gate line 121 electrically connected to the vertical signal line 172 through the contact portion 27, which are directly adjacent to the vertical signal line 172 in the first direction DR1, may be the normal pixels PXN.

On the other hand, for one vertical signal line 172, the pixel electrically connected to the horizontal gate line 121 that is electrically connected to the corresponding vertical signal line 172 through the contact portion 27, and a predetermined number (e.g., six in FIG. 5) of pixels R2 and B2 that are disposed therebelow and directly adjacent to the corresponding vertical signal line 172 in the first direction DR1, may be the kickback pixels PXK.

Alternatively, when the gate signal applied to one horizontal gate line 121 maintains the gate-on voltage only for 1H and gate-on voltage periods of neighboring gate signals do not overlap each other, the following may occur. For one vertical signal line 172, the pixels R1 and B1 that are disposed above and below the pixel connected to the horizontal gate line 121 electrically connected to the vertical signal line 172 through the contact portion 27, which are directly adjacent to the vertical signal line 172 in the first direction DR1, may be the normal pixels PXN.

On the other hand, for one vertical signal line 172, the pixels R2 and B2 that are connected to the horizontal gate line 121 electrically connected to the vertical signal line 172 through the contact portion 27, which are directly adjacent to the vertical signal line 172 in the first direction DR1, may be the kickback pixels PXK.

In the exemplary embodiment, since the green pixels PXG or G capable of displaying the green, which are relatively well recognized, are not immediately adjacent to the vertical signal line 172, all green pixels PXG or G may belong to the normal pixels PXN, but exemplary embodiments are not limited thereto.

At least one kickback pixel PXK, R2, and B2 may be disposed between the green pixel PXG or G and the vertical signal line 172 positioned closest to the green pixel PXG or G.

When the gate signal is upwardly sequentially applied from the horizontal gate line 121 at the lower side of the display panel 300, as illustrated in FIG. 5, the plurality of kickback pixels PXK may be inclined from the lower left portion to the upper right portion of the display area DA. Alternatively, when the gate signal is downwardly sequentially applied from the horizontal gate line 121 at the upper side of the display panel 300, the plurality of kickback pixels PXK may be inclined from the upper left portion to the lower right portion of the display area DA.

When the number of adjacent horizontal gate lines 121 electrically connected to one vertical signal line 172 through the contact portion 27 is "a" (wherein "a" is a natural number), the period during which the gate-on voltage of the gate signal is maintained is "b" horizontal periods (wherein "b" is a natural number), and the period in which the gate-on voltage periods of neighboring gate signals overlap each other is (b−1) horizontal periods, the number of pixel rows of the kickback pixels PXK adjacent to each other in the second direction DR2 may be a product of "a" and "b".

In the case of the kickback pixel PXK, the charging voltage of the pixel drops to be more than that of the normal pixel PXN, and thus deviation in luminance may occur. According to an exemplary embodiment, the luminance reduction of the kickback pixel PXK may be compensated by increasing the kickback voltage of the normal pixel PXN.

This will be described with reference to FIG. 6 to FIG. 11 together with the previously described drawings.

Figure 6:
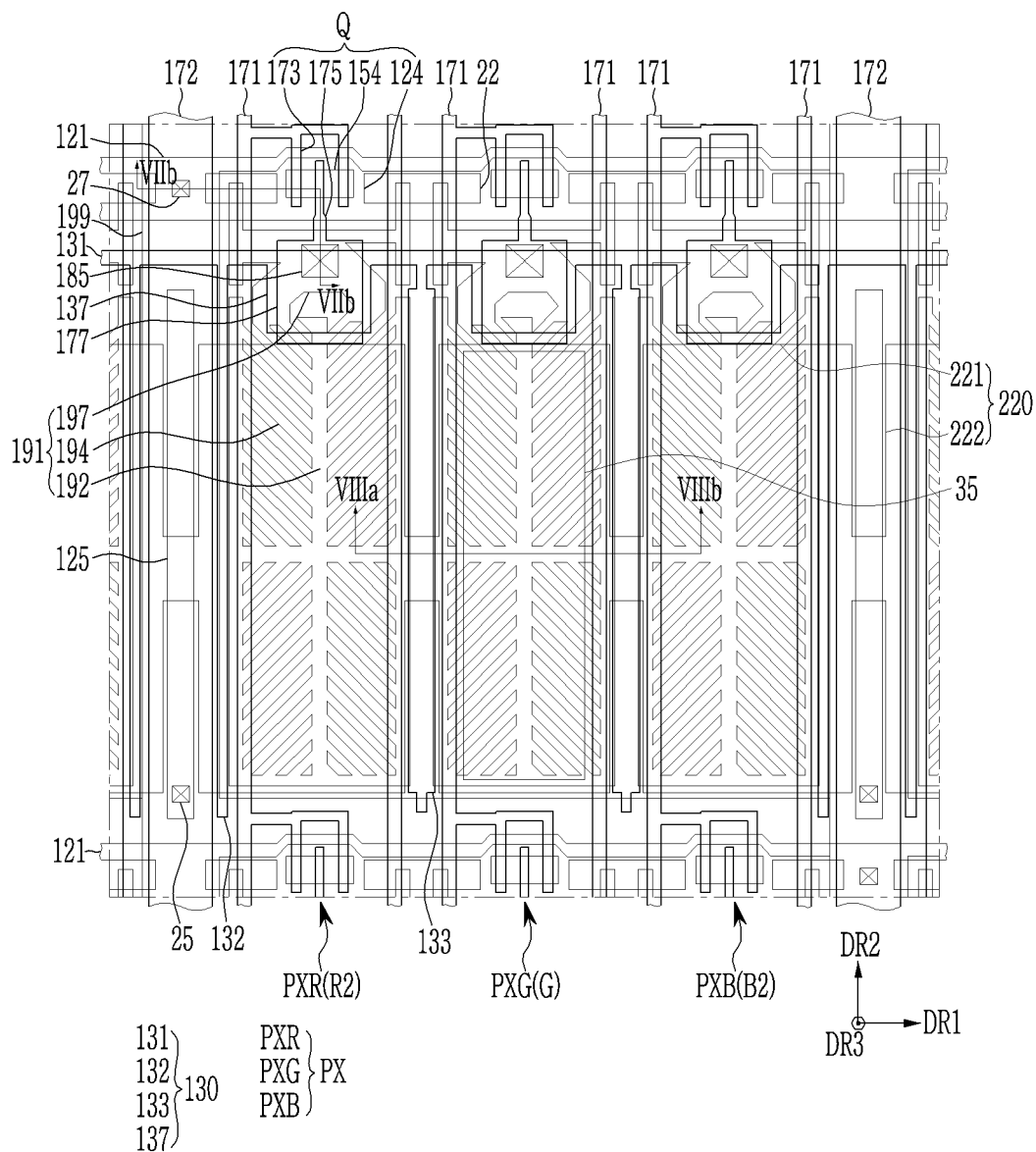
FIG. 6 is a layout view of three adjacent pixels of the display device of FIG. 1.
Figure 7:
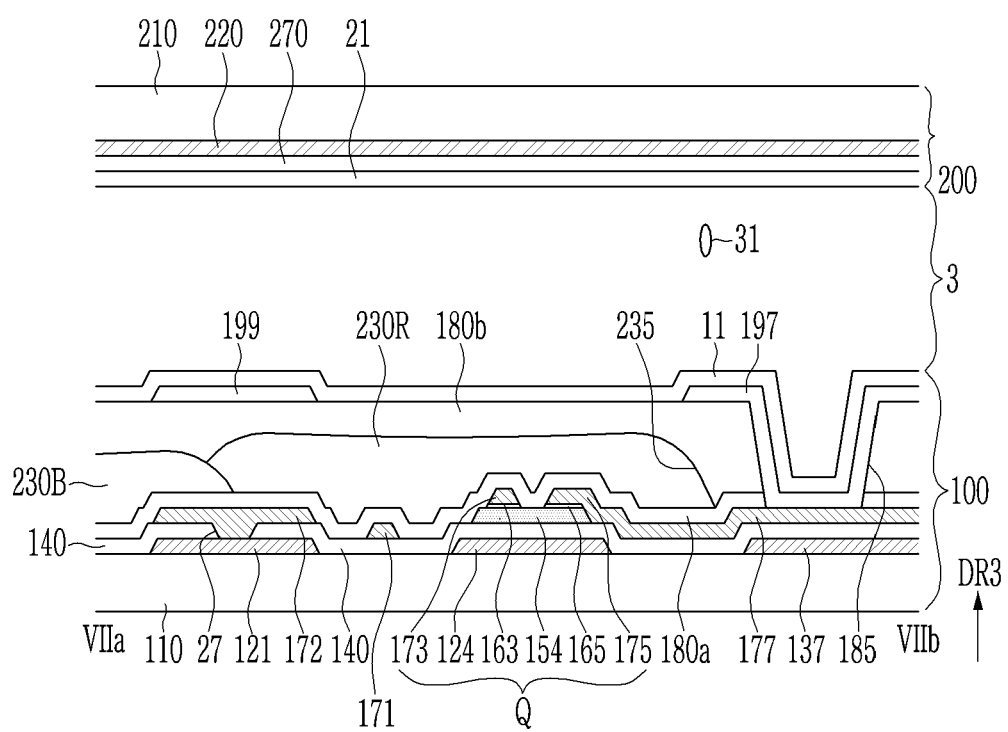
FIG. 7 is a cross-sectional view of an exemplary embodiment of the display device taken along a line VIIa-VIIb of FIG. 6.

FIG. 6 is a layout view of three adjacent pixels of the display device of FIG. 1, FIG. 7 is a cross-sectional view of an exemplary embodiment of the display device taken along a line VIIa-VIIb of FIG. 6, and FIG. 8, FIG. 9, FIG. 10, and FIG. 11 are cross-sectional views of the other exemplary embodiments of the display device taken along a line VIIIa-VIIIb illustrated in FIG. 6.

Figure 8:
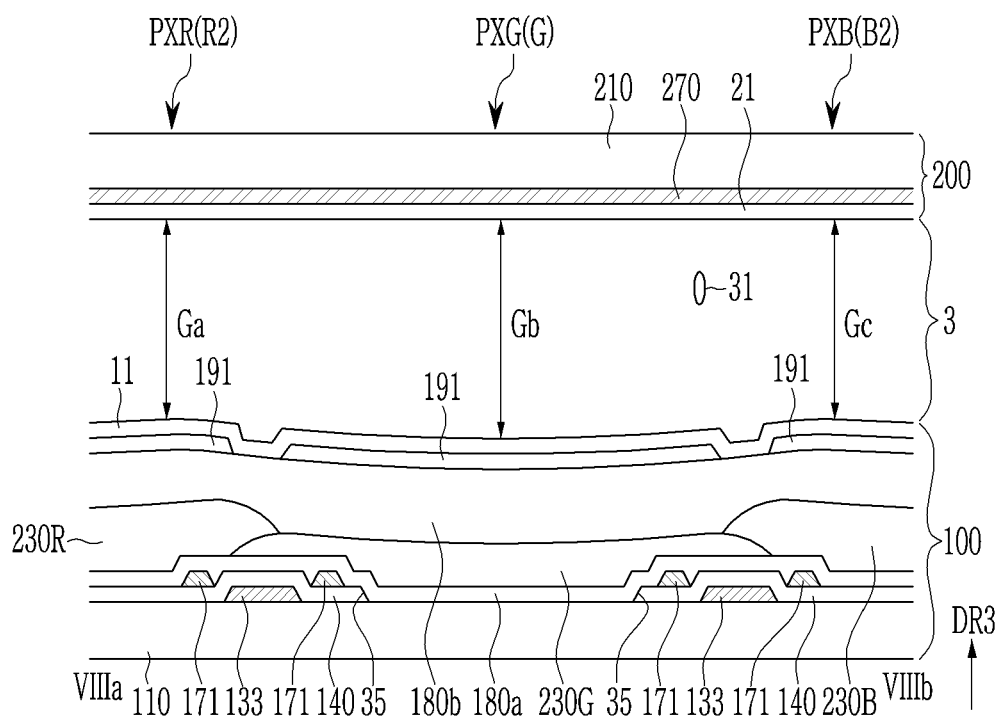
FIG. 8, FIG. 9, FIG. 10, and FIG. 11 are cross-sectional views of other exemplary embodiments of the display device taken along a line VIIIa-VIIIb illustrated in FIG. 6.

First, referring to FIG. 6 to FIG. 8, a display device according to an exemplary embodiment may be a liquid crystal display including a first display panel 100 and a second display panel 200 opposing the first display panel 100 with a liquid crystal layer 3 positioned between the first and second display panels 100 and 200.

The first display panel 100 may include a first substrate 110, and the second display panel 200 may include a second substrate 210. Herein, the term 'upper' with respect to the first substrate 110 indicates an upper side of two surfaces of the first substrate 110 toward the liquid crystal layer 3, and the term 'lower' with respect to the second substrate 210 indicates a lower side of two surfaces of the first substrate 110 toward the liquid crystal layer 3.

For example, the first display panel 100 may include a plurality of horizontal gate lines 121, a plurality of storage electrode lines 130, and a conductor 125 that are positioned on the first substrate 110.

The horizontal gate line 121, the storage electrode line 130, and the conductor 125 may be formed as the same gate conductive layer on the substrate 110.

Each of the horizontal gate lines 121 may substantially extend in the first direction DR1. Each of the horizontal gate lines 121 may include a plurality of gate electrodes 124. Each of the horizontal gate lines 121 may have openings 22 positioned at opposite sides of each gate electrode 124 in the first direction DR1.

The storage electrode line 130 may be separated from the horizontal gate line 121 to transfer a substantially constant voltage. Each of the storage electrode lines 130 may include a horizontal line 131 extending in the first direction DR1, vertical portions 132 and 133 extending in the second direction DR2 from the horizontal line 131, and an extension 137 protruding from the horizontal line 131.

The extension 137 may be positioned between two adjacent vertical portions 132 and 133.

The vertical portion 133 may be positioned between two neighboring pixels PXR, PXG, and PXB in the first direction DR1.

The conductor 125 may extend in the second direction DR2, and may be electrically floating.

A gate insulating layer 140 may be positioned on the gate conductive layer. The gate insulating layer 140 may include an insulating material such as a silicon nitride (SiNx), a silicon oxide (SiOx), and a silicon oxynitride.

The gate insulating layer 140 may include a contact portion 27 which is an opening positioned on the horizontal gate line 121 and an opening 25 positioned on the conductor 125.

A semiconductor layer including a plurality of semiconductors 154 may be disposed on the gate insulating layer 140. The semiconductor layer may include a semiconductor material such as an amorphous silicon, a polycrystalline silicon, or a metal oxide.

The semiconductors 154 are respectively positioned on the gate electrodes 124, and may overlap the gate electrode 124 in a plan view (or in a direction that is perpendicular to an upper surface of the first substrate 110).

Ohmic contact layers 163 and 165 may be disposed on the semiconductor layer. The ohmic contact layers 163 and 165 may include n+ hydrogenated amorphous silicon or a silicide in which an N-type impurity such as phosphorus is doped with the high concentration.

A data conductive layer including a plurality of data lines 171, a plurality of vertical signal lines 172, a plurality of source electrodes 173, and a plurality of drain electrodes 175 may be disposed on the ohmic contact layers 163 and 165 and the gate insulating layer 140.

Each of the data lines 171 may transfer a data voltage, and may generally extend in the second direction DR2 to intersect the horizontal gate line 121 and the storage electrode line 130.

Each of the vertical signal lines 172 may transfer a gate signal, and may generally extend in the second direction DR2 to intersect the horizontal gate line 121 and the storage electrode line 130. The vertical signal line 172 may be in contact with the horizontal gate line 121 through the contact portion 27, which is an opening of the gate insulating layer 140 to be electrically connected thereto. In addition, the vertical signal line 172 may be electrically connected to the conductor 125 through the opening 25 of the gate insulating layer 140. The vertical signal line 172 may be electrically connected to the conductor 125 extending in the second direction DR2 to reduce resistance and thus to reduce delay of the gate signal.

The source electrode 173 positioned in each of the pixels PXR, PXG, and PXB may protrude from the corresponding data line 171 to receive a data voltage. Each source electrode 173 may include a portion that overlaps the gate electrode 124 and is bent to have a U shape, or an upside-down U shape. However, the shape of the source electrode 173 is not limited thereto.

The drain electrode 175 is separated from the data line 171 and the source electrode 173.

The drain electrode 175 may have a first end portion facing the source electrode 173 and surrounded by a curved portion of the source electrode 173 in a region overlapping the gate electrode 124 and the semiconductor 154. The drain electrode 175 may include an extension 177 positioned at a second end portion.

In a plan view, the extension 177 may overlap the extension 137 of the storage electrode line 130. The extension 177 of the drain electrode 175 and the extension 137 of the storage electrode line 130 overlapping each other with the gate insulating layer 140 disposed therebetween may constitute a storage capacitor capable of maintaining a charging voltage of each of the pixels PXR, PXG, and PXB.

An opening 22 of the horizontal gate line 121 may overlap the data line 171 intersecting the horizontal gate line 121 to reduce signal delay caused by coupling between the horizontal gate line 121 and the data line 171.

The ohmic contact layers 163 and 165 may be disposed only between the semiconductor 154 thereunder and the data conductive layer thereon to reduce contact resistance therebetween.

At least one of the gate conductive layer and the data conductive layer may include at least one of copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), and an alloy thereof.

The gate electrode 124, the source electrode 173, and the drain electrode 175 constitute a transistor Q as a switching element together with the overlapping semiconductor 154. A channel of the transistor Q is disposed on semiconductor 154 between the source electrode 173 and the drain electrode 175.

An insulating layer 180a may be disposed on the data conductive layer, and a plurality of color filters 230R, 230G, and 230B may be disposed on the insulating layer 180a.

The color filters 230R, 230G, and 230B may display one of three primary colors such as red, green, and blue, or four primary colors. The color filters 230R, 230G, and 230B having different primary colors in a plan view may be alternately disposed in the first direction DR1.

The color filters 230R, 230G, and 230B may have an opening 235 positioned above the extension 177 of the drain electrode 175.

An insulating layer 180b may be disposed on the color filters 230R, 230G, and 230B.

The insulating layer 180a and the insulating layer 180b may include an inorganic insulating material such as a silicon nitride, a silicon oxide, and a silicon oxynitride, and/or an organic insulating material. For example, the insulating layer 180a may include an inorganic insulating material, and the insulating layer 180b may include an organic insulating material. In this case, an upper surface of the insulating layer 180b may be substantially flat.

The insulating layer 180b may serve as an overcoat for the color filters 230R, 230G, and 230B to prevent the color filters 230R, 230G, and 230B from being exposed, and impurities such as pigments included in the color filters 230R, 230G, and 230B from entering the liquid crystal layer 3.

The insulating layer 180a and the insulating layer 180b may have openings 185 that are positioned on the extension portion 177 of the drain electrode 175 to overlap the extension portion 177. The openings 185 may be positioned in the openings 235 of the color filters 230R.

A pixel electrode layer including a plurality of pixel electrodes 191 and a shielding electrode 199 may be disposed on the insulating layer 180b.

The overall shape of each of the pixel electrodes 191 may be a generally polygonal shape, such as a substantially quadrangular shape, and the pixel electrodes 191 may be partially removed.

Specifically, the pixel electrode 191 may be partially removed to have a plurality of branch portions 194. Each of the branch portions 194 may include portions extending in an oblique direction in the first direction DR1 and the second direction DR2. The pixel electrodes 191 between neighboring branch portions 194 are removed to form slits.

Each of the pixel electrodes 191 may further include a cross-shaped stem portion 192 and an extension 197.

Each of the stem portions 192 may have a portion extending in a direction substantially parallel to the first direction DR1 and a portion extending in a direction substantially parallel to the second direction DR2.

Each of the branch portions 194 may have a shape protruding from the stem portion 192.

The extension 197 of each of the pixel electrodes 191 may overlap the extension 177 of the drain electrode 175 in a plan view. The extension 197 of each of the pixel electrodes 191 may be electrically connected to the extension 177 of the drain electrode 175 through the openings 185 of the insulating layers 180a and 180b so that the pixel electrode 191 may receive a data voltage from the drain electrode 175.

In a plan view, most of the pixel electrodes 191 may transmit light to constitute a display unit capable of displaying an image.

The shielding electrode 199 may include a vertical shielding portion spaced apart from the pixel electrode 191 and generally extending in the second direction DR2 to overlap the vertical signal line 172, and a horizontal shielding portion extending in the first direction DR1 and overlapping a space between the horizontal gate line 121 and the pixel electrode 191. The vertical shielding portion of the shielding electrode 199 may overlap the vertical signal line 172 to prevent capacitive coupling between the vertical signal line 172 and another conductive layer adjacent to the vertical signal line 172.

The pixel electrode layer may include a transparent conductive material such as an indium tin oxide (ITO), an indium zinc oxide (IZO), a metal thin film, or the like.

The second display panel 200 will now be described. A light blocking member 220 may be positioned below the second substrate 210.

Referring to FIG. 6, in a plan view, the light blocking member 220 may include a horizontal light blocking unit 221 mainly extending in the first direction DR1 and overlapping the transistor Q, and a vertical light-shielding portion 222 mainly extending in the second direction DR2. The horizontal light blocking unit 221 may prevent light leakage between neighboring pixels PXR, PXG, and PXB in the second direction DR2, and the vertical light blocking unit 222 may be disposed between neighboring pixels PXR, PXG, and PXB in the first direction DR1 to prevent light leakage between neighboring pixels PXR, PXG, and PXB.

The vertical portion 133 of the storage electrode line 130 described above overlaps most of a space between two neighboring pixel electrodes 191 in the first direction DR1 to prevent light leakage between two neighboring pixels PXR, PXG, and PXB in the first direction DR1.

A common electrode 270 may be disposed below the light blocking member 220. The common electrode 270 may be continuously formed in most of a region corresponding to the display area DA. The common electrode 270 may include a transparent conductive material such as ITO and IZO, or a metal such as aluminum, silver, chromium, or an alloy thereof.

In another exemplary embodiment, color filters 230R, 230G, and 230B may be disposed in the second display panel 200.

The liquid crystal layer 3 may include liquid crystal molecules 31 having dielectric anisotropy. The liquid crystal molecules 31 may be oriented such that their long axes are generally erected to be perpendicular to or to make an acute angle with surfaces of the substrates 110 and 210 in the absence of an electric field in the liquid crystal layer 3.

In each of the pixels PX, PXR, PXG, PXB, R1, B1, G, R2, and B2, the pixel electrode 191 and the common electrode 270 facing each other with the liquid crystal layer 3 therebetween may form a liquid crystal capacitor by using the liquid crystal layer 3 as a dielectric to maintain a charging voltage of each of the pixels PX, PXR, PXG, PXB, R1, B1, G, R2, and B2. The charging voltage, which is a pixel voltage of each of the pixels PX, PXR, PXG, PXB, R1, B1, G, R2, and B2 may determine the luminance of an image.

An alignment layer 11 may be disposed on the pixel electrode layer and the insulating layer 180b, and an alignment layer 21 may be disposed below the common electrode 270. Each of the two alignment layers 11 and 21 may be a vertical alignment layer.

Referring to FIG. 6, the horizontal gate line 121 overlaps the drain electrode 175 of the transistor Q that is electrically connected to the horizontal gate line 121 to form a first parasitic capacitor Cgs therebetween. Accordingly, when the level of the gate signal transferred by the horizontal gate line 121 is lowered from the gate-on voltage to the gate-off voltage, the voltage of the drain electrode 175 may also be lowered by the first parasitic capacitor Cgs. Thus, the voltage of the pixel electrode 191 electrically connected to the drain electrode 175 may also be lowered to generate a kickback voltage.

In addition, the pixel electrodes 191 of the pixels PXR and PXB immediately adjacent to the vertical signal line 172 in the first direction DR1 also form a second parasitic capacitor Cvp due to a fringe field between the pixel electrodes 191 and the vertical signal line 172. Accordingly, when a level of the gate signal transferred by the vertical signal line 172 is lowered from the gate-on voltage to the gate-off voltage, the voltage of the pixel electrodes 191 of the pixels PXR and PXB receiving the corresponding gate signal may also be lowered by the second parasitic capacitor Cvp such that an additional kickback voltage Vkb may be generated.

The additional kickback voltage Vkb may be proportional to a sum of the capacitance of the first parasitic capacitor Cgs and the capacitance of the second parasitic capacitor Cvp, as shown in the following equation, and may be inversely proportional to the capacitance of a total capacitor Ctotal formed by the drain electrode 175 and the pixel electrode 191.

$$Vkb \propto (Cgs+Cvp)/Ctotal$$

The total capacitor Ctotal may include the capacitance of the first parasitic capacitor Cgs and the second parasitic capacitor Cvp. In the case of a liquid crystal display, the total capacitor Ctotal of each pixel may include a liquid crystal capacitor and a storage capacitor.

The capacitance of the first parasitic capacitor Cgs of the normal pixels PXN, R1, G, and B1 and the capacitance of the first parasitic capacitor Cgs of the kickback pixels PXK, R2, and B2 may be substantially the same or similar. However, the capacitance of the second parasitic capacitor Cvp of the kickback pixels PXK, R2, and B2 is greater than that of the second parasitic capacitor Cvp of the normal pixels PXN, R1, G, and B1.

Referring to FIG. 6 and FIG. 8, when the gap between the first display panel 100 and the second display panel 200, i.e., the thickness of the liquid crystal layer 3 in the third direction DR3, is referred to as a cell gap, a cell gap Gb of the pixels R1, G, and B1, which are the normal pixels PXN, may be greater than cell gaps Ga and Gc of the pixels R2 and B2, which are the kickback pixels PXK. Accordingly, when the other conditions are the same, the capacitance of the liquid crystal capacitor of the normal pixel PXN including the pixels R1, G, and B1 is smaller than that of the liquid crystal capacitor of the kickback pixel PXK including the pixels R2 and B2.

Thus, the capacitance of the second parasitic capacitor Cvp of the kickback pixels PXK, R2, and B2 is greater than that of the second parasitic capacitor Cvp of the normal pixels PXN, R1, G, and B1, but the capacitance of the liquid crystal capacitors of the normal pixels PXN, R1, G, and B1 is smaller than that of the liquid crystal capacitors of the kickback pixels PXK, R2, and B2, and eventually, the kickback voltages Vkb of the kickback pixels PXK, R2, and B2 and the kickback voltages Vkb of the normal pixels PXK, R2, and B2 may be equal to each other. For example, an increase in the kickback voltage Vkb by the second parasitic capacitor Cvp of the kickback pixels PXK, R2, and B2 may be compensated by an increase in the kickback voltage Vkb by the liquid crystal capacitors of the normal pixels PXN, R1, G, and B1. Accordingly, a variation (difference) in the kickback voltage Vkb between the kickback pixels PXK, R2, and B2 and the normal pixels PXN, R1, G, and B1 may be reduced to prevent stains (irregularities) occurring in an image displayed by the display area DA.

Referring to FIG. 6 to FIG. 8, in the illustrated exemplary embodiment, the gate insulating layer 140 may have an opening 35 positioned in the normal pixels PXN, R1, G, and B1. Accordingly, the height of of the insulating layer 180a positioned above the opening 35 (step size) may be increased by the opening 35 positioned in the display unit of the normal pixels PXN, R1, G, and B1. Thus, the heights of upper surfaces of the insulating layer 180b and the color filter 230G positioned on the insulating layer 180a may be relatively lower than those of the kickback pixels PXK, R2, and B2. As a result, the cell gap Gb of the normal pixels PXN, R1, G, and B1 may be greater than those of the kickback pixels PXK, R2, and B2.

In a plan view, an area and/or a position of the opening 35 of the gate insulating layer 140 may be changed as necessary.

According to another exemplary embodiment, the kickback voltage Vkb of the kickback pixels PXK, R2, and B2 and the kickback voltages Vkb of the normal pixels PXN, R1, G, and B1 may be compensated to have the substantially same voltage level by reducing the capacitance of the storage capacitor of the normal pixel PXN to be smaller than that of the liquid crystal capacitor of the kickback pixel PXK.

Figure 9:
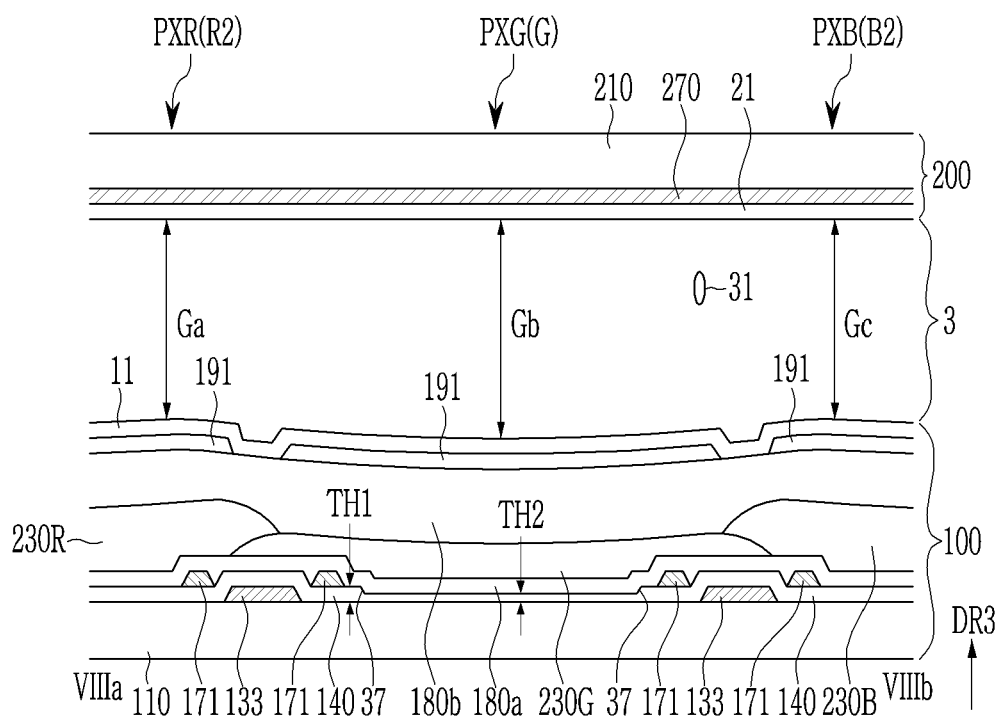

Next, referring to FIG. 9, the display device according to the illustrated exemplary embodiment is mostly the same as the above-described exemplary embodiment, but the gate insulating layer 140 may have a recess (groove) 37 positioned in the normal pixels PXN, R1, G, and B1. In a plan view, the recess 37 may have substantially the same shape as or similar shape to the opening 35 illustrated in FIG. 6 described above. However, the recess 37 may not pass through the gate insulating layer 140. The thickness TH2 of the gate insulating layer 140, in which the recess 37 is positioned, in the third direction DR3, is smaller than a thickness TH1 of the gate insulating layer 140, in which the recess 37 is not positioned, in the third direction DR3.

In other words, the average thickness of the gate insulating layer 140 disposed in the normal pixels PXN, R1, G, and B1 may be smaller than the average thickness of the gate insulating layer 140 positioned in the kickback pixels PXK, R2, and B2.

Accordingly, the step size of the insulating layer 180a positioned above the recess 37 may be increased by the recess 37 of the gate insulating layer 140 positioned in the display unit of the normal pixels PXN, R1, G, and B1, and the heights of upper surfaces of the insulating layer 180b and the color filter 230G positioned on the insulating layer 180a may be relatively lower than those of the kickback pixels PXK, R2, and B2. As a result, the cell gap Gb of the normal pixels PXN, R1, G, and B1 may be greater than those of the kickback pixels PXK, R2, and B2.

Figure 10:
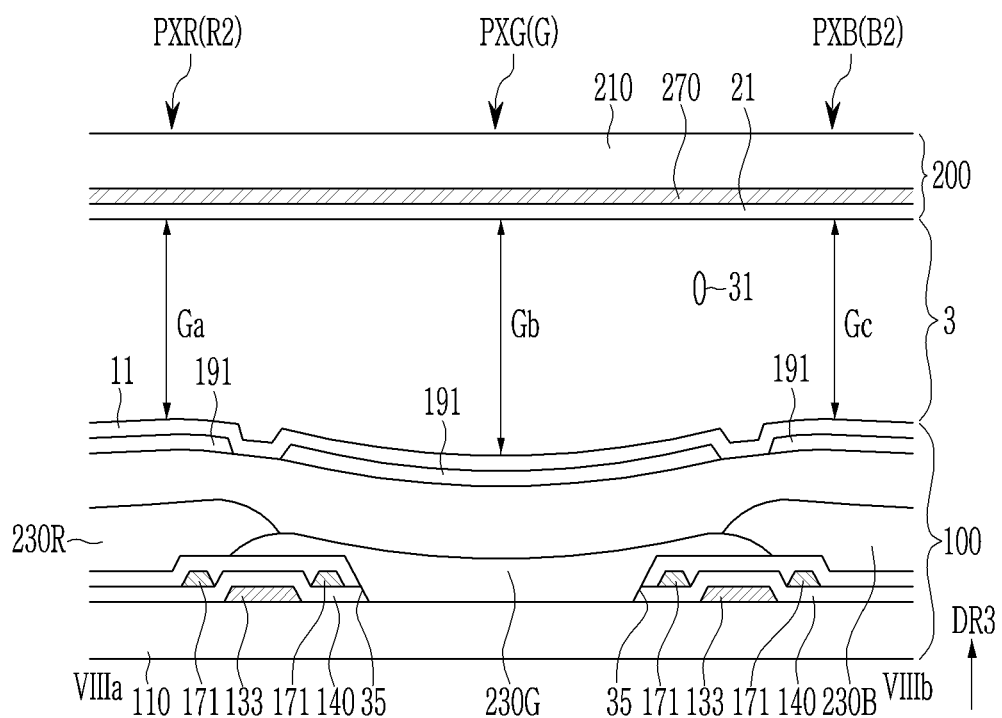

Next, referring to FIG. 10, the display device according to the illustrated exemplary embodiment is mostly the same as the exemplary embodiments illustrated in FIG. 5 to FIG. 8 described above, but not only the gate insulating layer 140 but also at least one other insulating layer may have an opening corresponding to the opening 35. For example, as illustrated in FIG. 10, the gate insulating layer 140 and the insulating layer 180a may have the opening 35 positioned in the normal pixels PXN, R1, G, and B1. Accordingly, the step size of the insulating layer 180a positioned above the opening 35 may be increased by the opening 35 positioned in the display unit of the normal pixels PXN, R1, G, and B1, and the heights of upper surfaces of the insulating layer 180b and the color filter 230G positioned on the insulating layer 180a may be relatively lower than those of the kickback pixels PXK, R2, and B2. As a result, the cell gap Gb of the normal pixels PXN, R1, G, and B1 may be greater than those of the kickback pixels PXK, R2, and B2.

In particular, when it is necessary to make the cell gap Gb be larger than in the exemplary embodiment illustrated in FIG. 6 to FIG. 8, it is possible to increase the cell gap Gb of the normal pixels PXN, R1, G, and B1 by forming the opening 35 in the plurality of insulating layers disposed in the normal pixels PXN, R1, G, and B1 as illustrated in FIG. 10 or by forming the recess 37 in the gate insulating layer 140 disposed in the normal pixels PXN, R1, G, and B1 as illustrated in FIG. 9.

Figure 11:
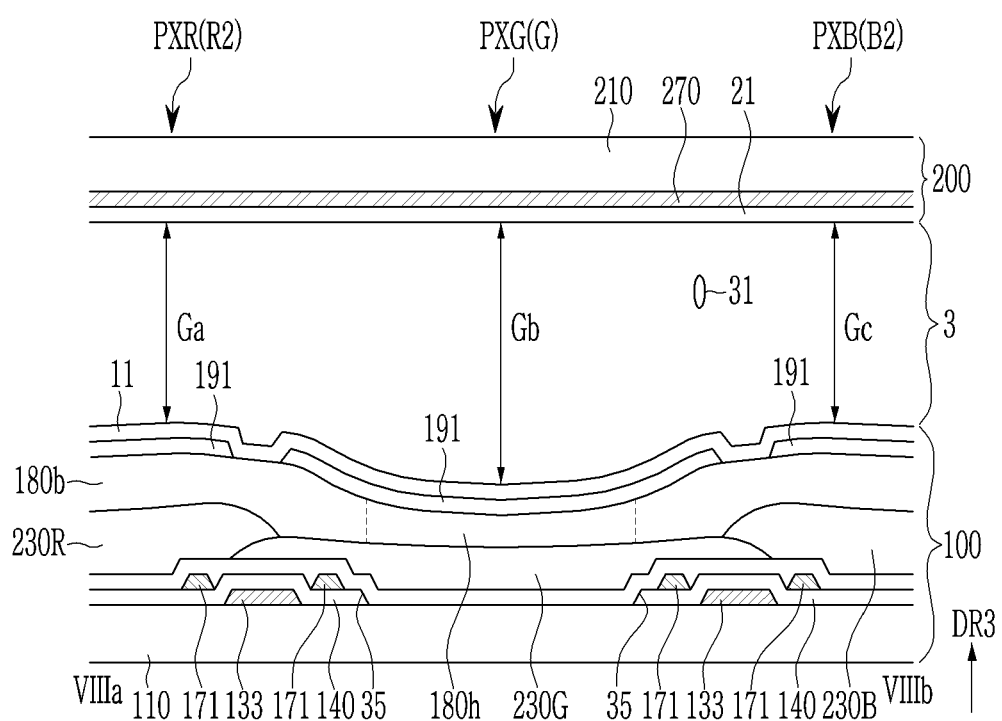

Referring to FIG. 11, the display device according to the illustrated exemplary embodiment is mostly the same as the above-described various embodiments, but the thickness of the insulating layer 180b disposed in the normal pixels PXN, R1, G, and B1 in the third direction DR3 may be smaller than that of the insulating layer 180b disposed in the kickback pixels PXK, R2, and B2 in the third direction DR3. For example, the thickness of the insulating layer 180b in the third direction DR3 may be differently formed by irradiating a greater amount of light or a smaller amount of light using a halftone mask on the insulating layer 180b positioned in the normal pixels PXN, R1, G, and B1 than that of the insulating layer 180b disposed in the kickback pixels PXK, R2, and B2.

Accordingly, the height of the upper surface of the insulating layer 180b disposed in the normal pixels PXN, R1, G, and B1 may be lower than the height of the upper surface of the insulating layer 180b disposed in the kickback pixels PXK, R2, and B2. As a result, the cell gap Gb of the normal pixels PXN, R1, G, and B1 may be greater than that of the kickback pixels PXK, R2, and B2.

Hereinafter, a display device according to an exemplary embodiment will be described with reference to FIG. 12 together with the drawings described above.

Figure 12:
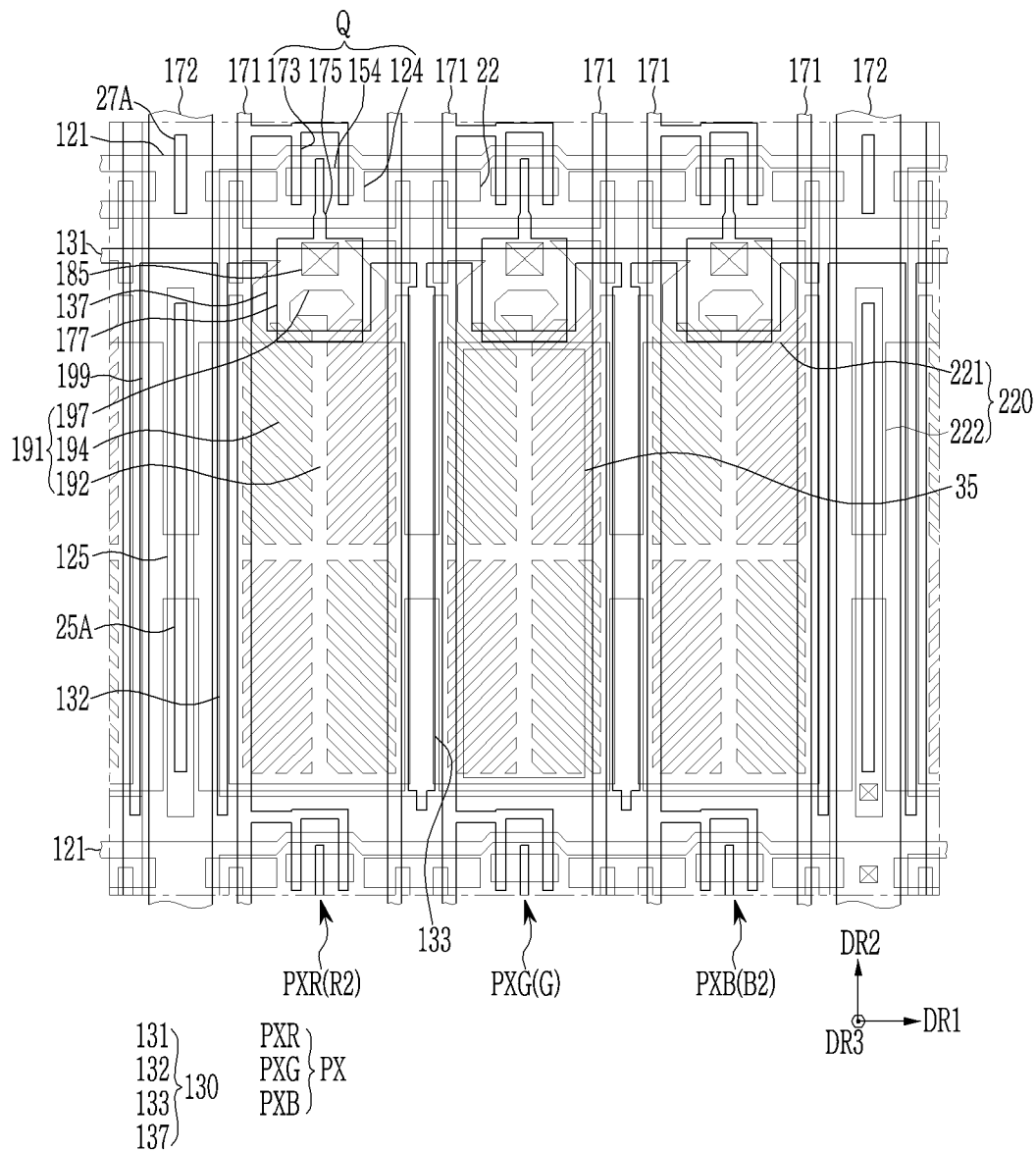
FIG. 12 is a layout view of another exemplary embodiment of the three adjacent pixels of the display device of FIG. A.

FIG. 12 is a layout view of another exemplary embodiment of the three adjacent pixels of the display device of FIG. 1.

Referring to FIG. 12, the display device according to the illustrated exemplary embodiment is mostly the same as the display device according to various exemplary embodiments described above, but the gate insulating layer 140 may have an opening 25A positioned on the conductor 125 and a contact portion 27A which is an opening positioned on the horizontal gate line 121, instead of the opening 25 and the contact portion 27 which is an opening.

The opening 25A may extend longer in the second direction DR2 than the opening 25 described above. Accordingly, contact resistance between the vertical signal line 172 and the conductor 125 electrically connected to the conductor 125 through the opening 25A may be reduced, resistance of the vertical signal line 172 may be reduced, and a delay of the gate signal may be reduced.

The contact portion 27A may extend further in the second direction DR2 than the contact portion 27 described above. Accordingly, the contact resistance between the vertical signal line 172 and the horizontal gate line 121 that are electrically connected to each other through the contact portion 27 may be reduced, and the delay of the gate signal may be reduced.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a first substrate and a second substrate facing each other;
   a liquid crystal layer disposed between the first substrate and the second substrate;
   a plurality of horizontal gate lines disposed on the first substrate and extending generally in a first direction;
   a plurality of vertical signal lines disposed in a conductive layer that is different from the horizontal gate lines and extending in a second direction intersecting the first direction;
   a contact region electrically connecting one of the horizontal gate lines to one of the vertical signal lines;
   a plurality of data lines extending in the second direction; and
   a plurality of pixels including transistors that are electrically connected to the horizontal gate lines and the data lines,
   wherein the plurality of pixels includes a kickback pixel defined as a pixel that is affected by a kickback voltage caused by the one vertical signal line, and a normal pixel defined as a pixel that is less affected by the kickback voltage caused by the one vertical signal line than the kickback pixel, and
   wherein the liquid crystal layer in the kickback pixel has a first cell gap, and the liquid crystal layer in the normal pixel has a second cell gap greater than the first cell gap.

2. The display device of claim 1, wherein the kickback pixel is directly adjacent to the one vertical signal line in the first direction.

3. The display device of claim 2, wherein the kickback pixel comprises a first kickback pixel and a second kickback pixel that are disposed at opposite sides of one of the plurality of vertical signal lines and are configured to display different colors.

4. The display device of claim 3, wherein:
   the normal pixel comprises a first normal pixel to display a different color than the colors displayed by the first kickback pixel and the second kickback pixel, and
   at least one of the first and second kickback pixels is disposed between the first normal pixel and a vertical signal line of the plurality of vertical signal lines disposed closest to the first normal pixel.

5. The display device of claim 1, wherein the contact region comprises a contact portion, and the normal pixel is adjacent or spaced in the second direction with respect to a pixel electrically connected to the one horizontal gate line that is electrically connected to the one vertical signal line through the contact portion.

6. The display device of claim 5, wherein the kickback pixel comprises a pixel in at least one pixel row that is adjacent in a direction opposite to the second direction with respect to a pixel electrically connected to the one horizontal gate line that is electrically connected to the one vertical signal line through the contact portion.

7. The display device of claim 1, wherein a number of pixel rows of the kickback pixel adjacent to each other in the second direction is a product of "a" and "b" when a number of adjacent horizontal gate lines electrically connected to one of the plurality of vertical signal lines through the contact region is "a" (wherein "a" is a natural number), when a period during which a gate-on voltage of a gate signal transmitted by the one horizontal gate line is maintained is "b" horizontal periods (wherein "b" is a natural number), and when a period in which gate-on voltage periods of neighboring gate signals overlap each other is (b−1) horizontal periods.

8. The display device of claim 1, further comprising a plurality of insulating layers positioned between the first substrate and the liquid crystal layer,
   wherein at least one insulating layer of the plurality of insulating layers in the normal pixel has a first thickness, and the at least one insulating layer in the kickback pixel has second thickness greater than the first thickness.

9. The display device of claim 8, wherein the first thickness is substantially zero.

10. The display device of claim 8, wherein:
the plurality of insulating layers comprises a first insulating layer disposed between the one horizontal gate line and the one vertical signal line,
the contact region comprises a contact portion formed in the first insulating layer as a first opening on the one horizontal gate line, and
the at least one insulating layer comprises the first insulating layer.

11. The display device of claim 1, further comprising:
a common electrode disposed below the second substrate and
a pixel electrode electrically connected to the transistors,
wherein the pixel electrode and the common electrode face each other with the liquid crystal layer therebetween to form a liquid crystal capacitor.

12. A display device comprising:
a first substrate and a second substrate facing each other;
a liquid crystal layer disposed between the first substrate and the second substrate;
a plurality of horizontal gate lines disposed on the first substrate and extending generally in a first direction;
a plurality of vertical signal lines disposed in a conductive layer that is different from the horizontal gate lines and extending in a second direction intersecting the first direction;
a contact region electrically connecting one of the horizontal gate lines to one of the vertical signal lines;
a plurality of data lines extending in the second direction; and
a plurality of pixels including transistors that are electrically connected to the horizontal gate lines and the data lines,
wherein the plurality of pixels includes a first pixel that is directly adjacent to the one vertical signal line in the first direction and a second pixel interposed between at least one pixel and the one vertical signal line adjacent to the second pixel, and
wherein the liquid crystal layer in the first pixel has a first cell gap, and the liquid crystal layer in the second pixel has a second cell gap greater than the first cell gap.

13. The display device of claim 12, wherein the first pixel comprises a first kickback pixel and a second kickback pixel that are disposed at opposite sides of a vertical signal line of the plurality of vertical signal lines and are configured to display different colors.

14. The display device of claim 13, wherein the second pixel is configured to display a different color than colors displayed by the first kickback pixel and the second kickback pixel.

15. The display device of claim 12, further comprising a plurality of insulating layers positioned between the first substrate and the liquid crystal layer,
wherein at least one insulating layer of the plurality of insulating layers disposed in the first pixel has a first thickness, the at least one insulating layer in the second pixel has a second thickness smaller than the first thickness.

16. The display device of claim 15, wherein the first thickness is substantially zero.

17. The display device of claim 15, wherein:
the plurality of insulating layers comprises a first insulating layer disposed between the one horizontal gate line and the one vertical signal line,
the contact region comprises a contact portion formed in the first insulating layer as a first opening on the one horizontal gate line, and
the at least one insulating layer comprises the first insulating layer.

18. The display device of claim 12, further comprising:
a common electrode disposed below the second substrate; and
a pixel electrode electrically connected to the transistors,
wherein the pixel electrode and the common electrode face each other with the liquid crystal layer therebetween to form a liquid crystal capacitor.

19. A display device comprising:
a first substrate;
a plurality of horizontal gate lines disposed on the first substrate and extending generally in a first direction;
a plurality of vertical signal lines disposed in a conductive layer that is different from the horizontal gate lines and extending in a second direction intersecting the first direction;
a plurality of data lines extending in the second direction;
a transistor electrically connected to a horizontal gate line of the plurality of horizontal gate lines and a data line of the plurality of data lines;
a pixel electrode electrically connected to the transistor; and
an insulating layer disposed between the horizontal gate line and the vertical signal line,
wherein the insulating layer has an opening disposed on the horizontal gate line,
the vertical signal line is electrically connected to the horizontal gate line through the opening,
at least three pixel electrodes are adjacent to each other and disposed between two adjacent vertical signal lines, and
the insulating layer overlapping a first pixel electrode disposed in the middle of the at least three pixel electrodes has a first average thickness and the insulating layer overlapping a second pixel electrode of the at least three pixel electrode immediately adjacent the vertical signal lines has a second average thickness, with the first average thickness being smaller than the second average thickness.

20. The display device of claim 19, wherein the insulating layer overlapping the first pixel electrode has a recess overlapping the first pixel electrode.

* * * * *